United States Patent
Ogiwara et al.

(10) Patent No.: US 8,045,357 B2
(45) Date of Patent: Oct. 25, 2011

(54) SEMICONDUCTOR MEMORY DEVICE

(75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 12/553,819

(22) Filed: Sep. 3, 2009

(65) Prior Publication Data

US 2010/0091547 A1   Apr. 15, 2010

(30) Foreign Application Priority Data

Oct. 14, 2008   (JP) ................. 2008-265318

(51) Int. Cl.
*G11C 11/22* (2006.01)
*G11C 7/00* (2006.01)
*G11C 7/22* (2006.01)
*G11C 7/24* (2006.01)

(52) U.S. Cl. .............. 365/145; 365/189.14; 365/189.15; 365/189.16; 365/193; 365/195; 365/222; 365/233.14; 365/233.16; 365/233.17; 365/233.19

(58) Field of Classification Search .......... 365/145, 365/189.14, 189.15, 189.16, 193, 195, 222, 365/233.14, 233.16, 233.17, 233.19
See application file for complete search history.

(56) References Cited

U.S. PATENT DOCUMENTS

| 5,619,470 | A | * | 4/1997 | Fukumoto | 365/228 |
| 5,835,400 | A | * | 11/1998 | Jeon et al. | 365/145 |
| 5,892,705 | A | | 4/1999 | Chung | |
| 2003/0218925 | A1 | * | 11/2003 | Torjussen et al. | 365/200 |
| 2006/0146592 | A1 | * | 7/2006 | Lee et al. | 365/145 |
| 2006/0277367 | A1 | * | 12/2006 | Faber | 711/137 |
| 2007/0016719 | A1 | * | 1/2007 | Ono et al. | 711/103 |
| 2008/0111575 | A1 | | 5/2008 | Ogiwara et al. | |
| 2009/0096506 | A1 | | 4/2009 | Ogiwara et al. | |

OTHER PUBLICATIONS

Explanation of Non-English Language References in 2 pages.

* cited by examiner

*Primary Examiner* — J. H. Hur
(74) *Attorney, Agent, or Firm* — Knobbe, Martens Olson & Bear LLP

(57) ABSTRACT

A memory includes a memory cell array including destructive read-out type memory cells; a decoder selecting a cell; a sense amplifier configured to detect the data; and a read and write controller controlling a read operation and a write operation, wherein the read and write controller outputs a logical value of a write enable signal at the start of the read operation in a first period and makes the write enable signal invalid after the read operation starts during the first period, on the basis of the write enable signal and a restore signal keeping an activated state during the first period, the write enable signal being a signal allowing the write operation, the first period being a period from when the read operation starts to when a restore operation for writing the data back to the memory cell is completed.

9 Claims, 9 Drawing Sheets

POWER SUPPLY MONITORING CIRCUIT

SEMICONDUCTOR MEMORY DEVICE

CROSS-REFERENCE TO RELATED APPLICATION

This application is based upon and claims the benefit of priority from the prior Japanese Patent Applications No. 2008-265318, filed on Oct. 14, 2008, the entire contents of which are incorporated herein by reference.

BACKGROUND OF THE INVENTION

1. Field of the Invention

The present invention relates to a semiconductor memory device.

2. Related Art

FeRAMs (Ferroelectric Random Access Memories) are nonvolatile memories and destructive read-out type memories. Thus, during data read operations, after data is read from memory cells, the data must be restored surely in the memory cells in the FeRAM. In the data read of the FeRAM, a chip enable signal (bCE) is activated (logical low) while a write enable signal (bWE) is in an inactivated state (logical high). The FeRAM then enters the read operation. When the write enable signal (bWE) becomes activated (logical low) thereafter, however, the FeRAM enters a write operation. If such an operation is made in the FeRAM, the data is temporarily read from the memory cells and external data is waited to be inputted before the read data is restored. When the data is externally inputted to the FeRAM during the standby period, the externally inputted data is written in the memory cells. When the data is not inputted externally during the standby period, the read data is written back to the memory cells.

If power supplies suddenly shut down while the FeRAM waits the external data to be inputted, both the externally inputted data and the read data may not be written in the memory cells.

Such a problem also arises in memories operating in a burst mode that data is serially read from or written in a plurality of columns. The same problem occurs in the series connected TC unit type ferroelectric RAM.

SUMMARY OF THE INVENTION

A semiconductor memory device according to an embodiment of the present invention comprises: a memory cell array configured by two-dimensionally arranging destructive read-out type memory cells that stored data is degraded by data read; a decoder configured to select a memory cell in the memory cell array; a sense amplifier configured to detect the data stored in the selected memory cell; and a read and write controller configured to control a read operation for reading data externally from the memory cell and a write operation for writing external data in the memory cell, wherein the read and write controller outputs a logical value of a write enable signal at the start of the read operation in a first period and makes the write enable signal invalid after the read operation starts during the first period, on the basis of the write enable signal and a restore signal keeping an activated state during the first period, the write enable signal being a signal allowing the write operation, the first period being a period from when the read operation starts to when a restore operation for writing the data back to the memory cell is completed.

A memory system according to an embodiment of the present invention comprises: the semiconductor memory device according to any one of claims 1 to 4; and a power supply circuit configured to keep a power supply voltage to be supplied to the semiconductor memory device at a certain voltage or higher during the first period, wherein the power supply circuit comprises: a switch between an external power supply and the semiconductor memory device; a stabilizing capacity connected to a node between the switch and the semiconductor memory device; and a power supply monitoring circuit configured to receive a voltage of the external power supply and a reference power supply voltage and to compare the external power supply voltage to the reference power supply voltage, the reference power supply voltage serving as a threshold for the external power supply voltage, wherein the power supply monitoring circuit turns off the switch when the external power supply voltage gets across the reference power supply voltage.

DETAILED DESCRIPTION OF THE INVENTION

Embodiments of the present invention will be explained below in detail with reference to the accompanying drawings. Note that the invention is not limited thereto.

First Embodiment

Figure 1:
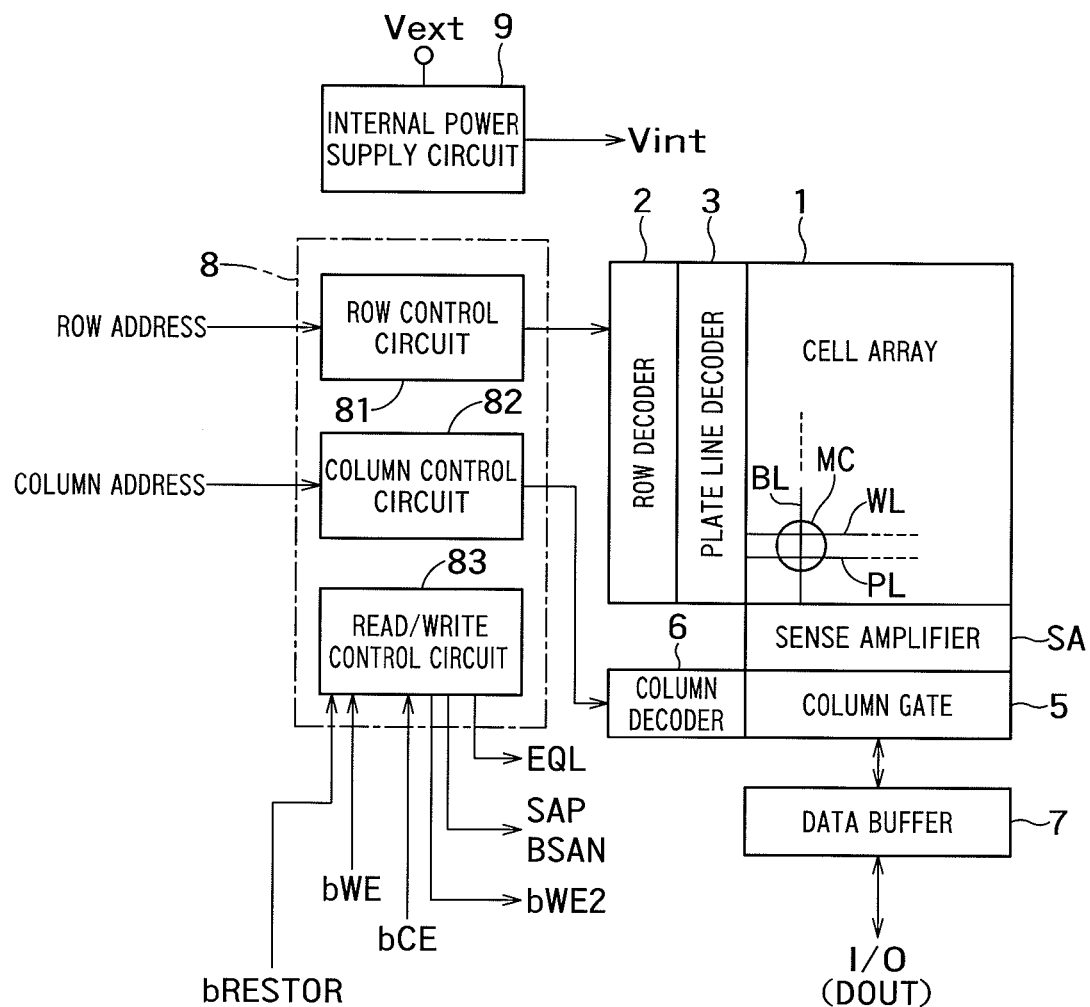
FIG. 1 is a block diagram showing a configuration of a ferroelectric memory according to a first embodiment of the present invention.

FIG. 1 is a block diagram showing a configuration of a ferroelectric memory according to a first embodiment of the present invention. The ferroelectric memory of the first embodiment can be "Series connected TC unit type ferroelectric RAM" in which consists of series connected memory cells each having a transistor having a source terminal and a drain terminal and a ferroelectric capacitor inbetween said two terminals.

The first embodiment can be applied to, in addition to the series connected TC unit type ferroelectric RAM, other ferroelectric memories. Further, the first embodiment can be applied to, in addition to the ferroelectric memories, other destructive read-out type memories. In the destructive read out memory, when data is read from memory cells, the data stored in the memory cells is degraded (destructed). Thus, when the data is read from the memory cells in the destructive read out memory, external write data must be written in the memory cells reliably or data detected by a sense amplifier SA must be written back reliably to the original memory cells (must be restored). That is, the present invention can be applied to any memories as long as they are destructive read-out type memories.

A memory cell array 1 includes a plurality of memory cells MC each of which comprises a ferroelectric capacitor and a cell transistor. The array is configured by two-dimensionally arranging these memory cells. The memory cell MC is arranged at an intersection of a bit line BL with a word line WL (an intersection of the bit line BL with a plate line PL).

A row decoder 2 drives a word line WL selected from the word lines WL. A plate line decoder 3 drives a plate line PL selected from the plate lines PL. A row control circuit 81 selects the word line WL and the plate line PL in a row depending on an externally received row address and controls the row decoder 2 and the plate line decoder 3 to drive the corresponding word line and plate line.

A column decoder 6 selects a bit line BL among the bit lines BL through a column gate 5. A sense amplifier SA is configured to read data stored in the memory cell MC or write data in the memory cell MC through the selected bit line BL. A column control circuit 82 controls the column decoder 6 to select the bit line BL in a column depending on an externally received column address.

A data buffer 7 is configured to temporarily store the read data detected by the sense amplifier SA and output the read data via an I/O circuit to external of the memory chip. Alternatively, the data buffer 7 is configured to transfer the externally inputted write data via the I/O circuit to the sense amplifier SA in the selected column.

According to a read operation for reading data externally, the sense amplifier SA detects the data stored in the memory cell MC and the detected data is outputted to external of the memory chip via the data buffer 7 and the I/O circuit. The read operation includes a restore operation for writing the data latched by the sense amplifier SA back to the original memory cell MC. According to a write operation for writing external data, after the sense amplifier SA detects the data in the read operation, the external write data is transmitted via the I/O circuit and the data buffer 7 to the sense amplifier SA, and the sense amplifier SA writes the write data in the memory cell MC.

A read/write control circuit 83 is configured to receive externally a chip enable signal bCE, a write enable signal bWE, and a restore signal bRESTOR and generate an equalize signal EQL and sense amplifier activating signals SAP and BSAN.

The chip enable signal bCE allows the memory chip of the first embodiment to be in an activated state so that the memory can be accessed. The write enable signal bWE allows either the write operation or the read operation. More specifically, if the write enable signal bWE is in an activated state (logical low) when the chip enable signal bCE is activated, the ferroelectric memory of the first embodiment enters the write operation. In contrast, if the write enable signal bWE is in an inactivated state (logical high) when the chip enable signal bCE is activated, the ferroelectric memory of the first embodiment enters the read operation. The restore signal bRESTOR keeps the activated state during a first period from when the ferroelectric memory enters the read operation to when the restore operation is completed.

An internal power supply circuit 9 is configured to receive an external power supply voltage Vext and generate an internal power supply voltage Vint. The internal power supply voltage Vint is supplied to components shown in FIG. 1. The internal power supply circuit 9 can include a boost circuit as needed.

The ferroelectric memory of the first embodiment becomes activated when a precharge state (standby state) ends and the chip enable signal bCE supplied from external to the chip becomes logically low. As the ferroelectric memory being in an activated state, a control circuit 8 including the row control unit 81, the column control circuit 82, and the read/write control circuit 83 allows access to the memory cell array 1.

Figure 2:
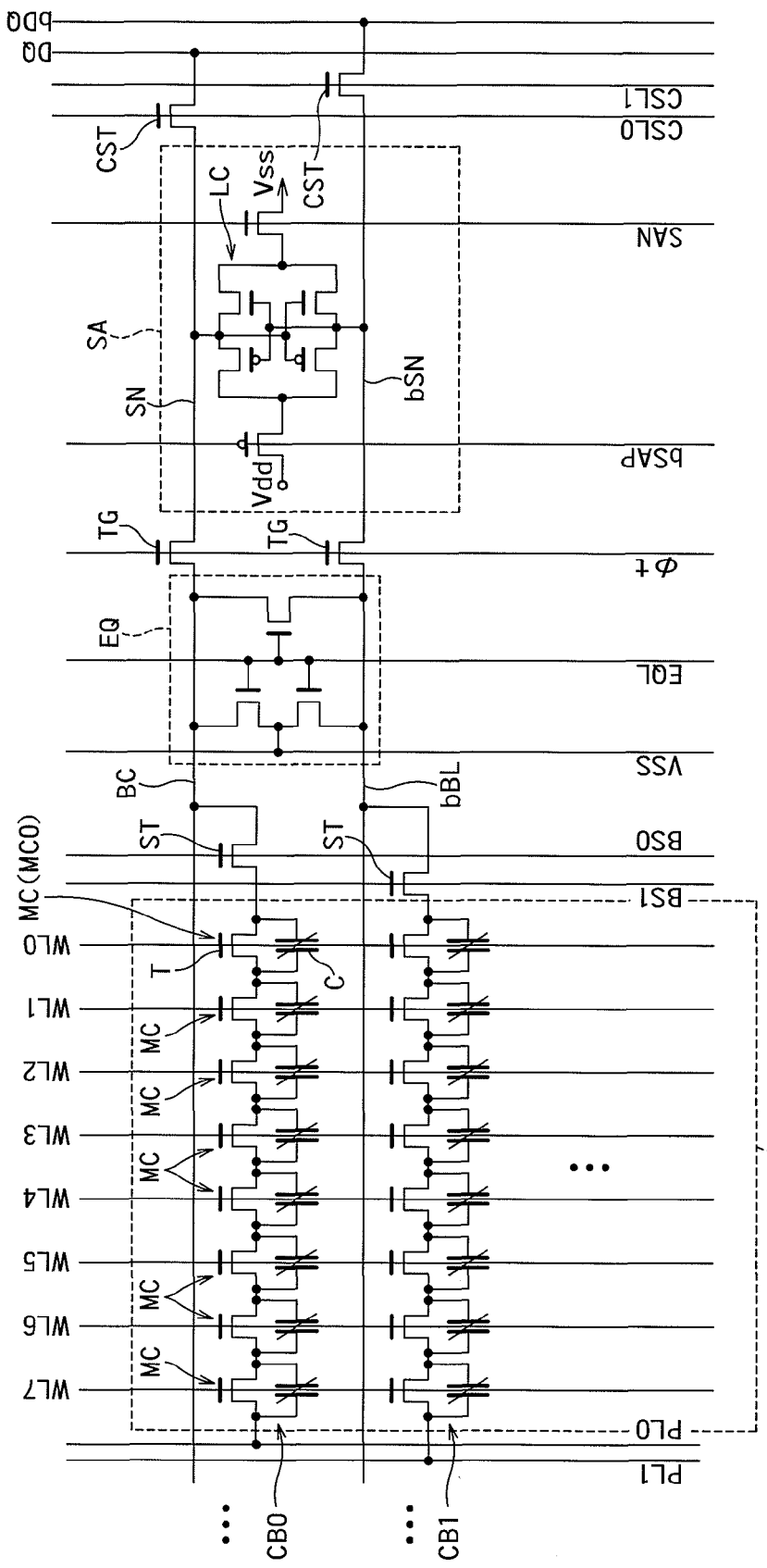
FIG. 2 is a circuit diagram showing an example of configuration of the memory cell array 1, the sense amplifier SA, and their peripheral circuit.

FIG. 2 is a circuit diagram showing an example of configuration of the memory cell array 1, the sense amplifier SA, and their peripheral circuit. The memory cell MC is a unit cell configured by connecting a cell transistor T to a ferroelectric capacitor C in parallel. A plurality of the memory cells MC are serially connected to each other to configure a cell block CB. In the first embodiment, eight memory cell MCs constitute one cell block CB. An end of the cell block CB is connected via a selective transistor ST to the bit line BL or bBL. The other end of the cell block CB is connected to the plate line PLi. A gate of the cell transistor T is connected to the word line WLi. The selective transistor ST is controlled by a block selective signal BSi.

The bit lines BL and bBL are connected via transfer gates TG to the respective sense nodes SN and bSN in the sense amplifier SA. The transfer gates TG are controlled by a signal φt. The sense amplifier SA includes a latch circuit LC. The latch circuit LC is controlled by the sense amplifier activating signals bSAP and SAN. The latch circuit LC latches the read data or the write data at the sense nodes SN and bSN. The bit lines BL and bBL transmit data whose logics are opposite to each other (complementary data) to the sense nodes SN and bSN. Thus, the sense amplifier SA latches the data whose logics are opposite to each other at the sense nodes SN and bSN.

In the first embodiment, by selecting a bit line pair BL, bBL in a column and the word line WL in a row, the memory cells MC at their intersection are selected.

The sense nodes SN and bSN are connected via the respective column selective transistors CST to the DQ lines DQ and bDQ. When the column selective line CSLi is selected, the column selective transistor CST in the selected column is switched on. Accordingly, the read data latched at the sense nodes SN and bSN in the selected column is outputted via the DQ lines DQ and bDQ to the data buffer 7 shown in FIG. 1. Meanwhile, the write data from the data buffer 7 is transmitted via the DQ lines DQ and bDQ to the sense nodes SN and bSN in the selected column. The sense amplifier SA latches the write data at the sense nodes SN and bSN and then writes the data in the selected memory cell MC.

An equalizing circuit EQ is configured to keep the bit lines BL and bBL equipotential (ground potential Vss) when the memory is in a standby state. When the memory is accessed for read or write, the equalizing circuit EQ is in an inactivated state.

Activation or the activated state means switching on or driving devices or circuits, and inactivation or the inactivated state means switching off or stopping devices or circuits. Thus, note that a logical high signal can be an activating signal or a logical low signal can be an activating signal. For example, NMOS transistors are activated when the gates are made to be logical high. PMOS transistors are activated when the gates are made to be logical low.

Figure 3:
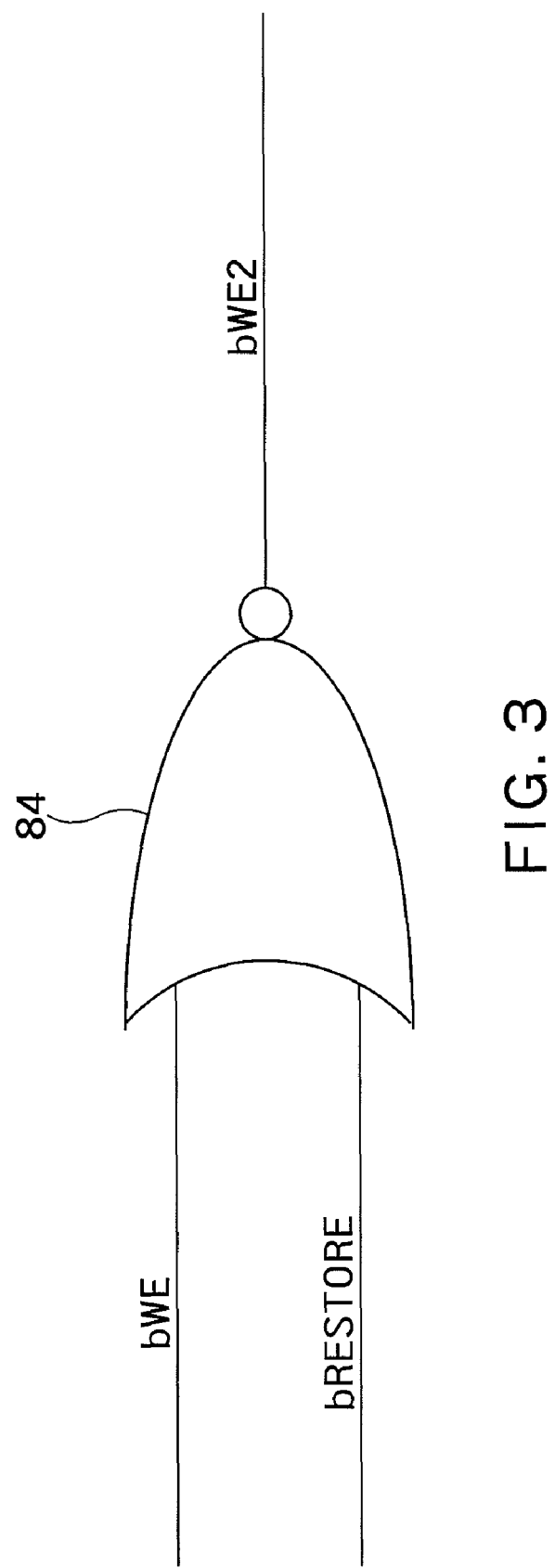
FIG. 3 shows a NOR circuit 84 for performing a logical operation of the write enable signal bWE and the restore signal bRESTOR.

FIG. 3 shows a NOR circuit 84 for performing a logical operation of the write enable signal bWE and the restore signal bRESTOR. The NOR circuit 84 serving as a logical unit is included in the read/write controller 83 shown in FIG.

1. The NOR circuit 84 receives the write enable signal bWE and the restore signal bRESTOR and performs the NOR operation of these signals. The NOR circuit 84 outputs the result of the operation as the write enable signal bWE2.

In the read operation, when the chip enable signal bCE is activated to be logical low, the write enable signal bWE is in an inactivated state (logical high). The restore signal bRESTOR is activated to be logical high when the read operation starts. Because the restore signal bRESTOR becomes logically high while the write enable signal bWE is in an inactivated state (logical high), the NOR circuit 84 keeps the inactivated state (logical low) of the write enable signal bWE2 as long as the restore signal bRESTOR is kept logically high. That is, the NOR circuit 84 can make the write enable signal bWE invalid during the read operation that the restore signal bRESTOR is kept logically high. Thus, even if a user activates the write enable signal bWE to be logical low, the inactivated state (logical low) of the write enable signal bWE2 is kept regardless of the logical value of the write enable signal bWE. As a result, the restore operation can be completed reliably during the read operation (first period).

Figure 4:
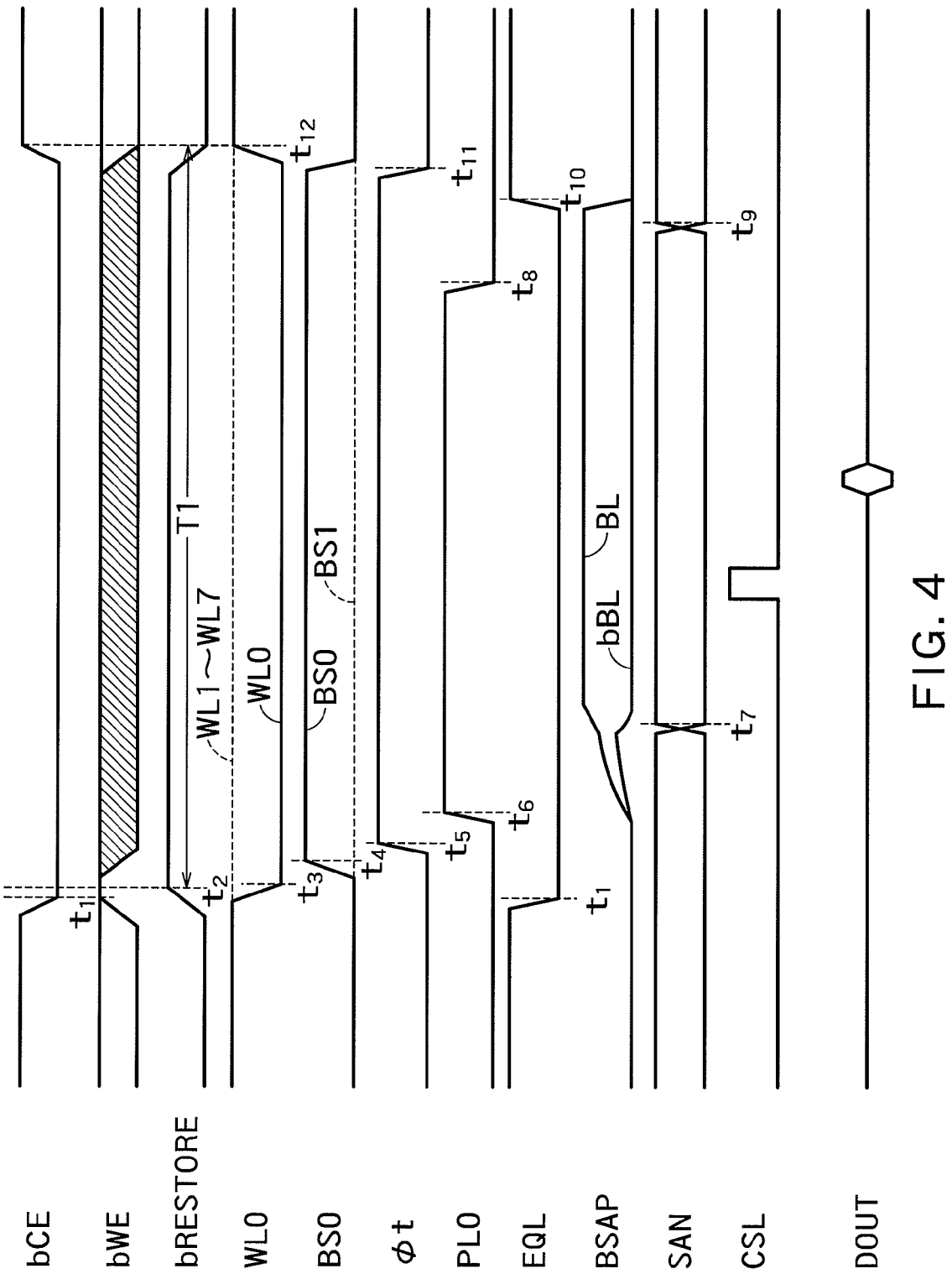
FIG. 4 is a timing chart showing the data read operation of the ferroelectric memory according to the first embodiment.

FIG. 4 is a timing chart showing the data read operation of the ferroelectric memory according to the first embodiment. The operation of ferroelectric memory of the first embodiment will be described with reference to FIGS. 2 and 4. The operation of reading the data from the memory cell MC0 shown in FIG. 2 will be described. Because the read operations for other memory cells MC can be assumed easily from the following description, descriptions thereof will be omitted.

The ferroelectric memory of the first embodiment starts the data read operation or the data write operation when the chip enable signal bCE becomes activated (logical low). As shown in FIG. 4, if the write enable signal bWE is inactivated (logical high) when the chip enable signal bCE is activated to be logical low (t1), the ferroelectric memory enters the read operation. The equalizing signal EQL is inactivated at t1 to end the precharge state. Thus, the equalizing circuit EQ shown in FIG. 2 becomes inactivated.

The restore signal bRESTOR is activated to be logical high simultaneously with t1 or at t2 immediately after t1. The NOR gate 84 shown in FIG. 3 keeps the inactivated state (logical low) of the write enable signal bWE2. The signal bWE2 is kept inactivated during the first period T1 from when the read operation starts to when the restore operation is completed.

Thereafter, at t3, the selected word line WL0 is inactivated to be logical low and the cell transistor T connected to the selected word line WL0 (see FIG. 2) is switched off. Unselected word lines WL1 to WL7 keep the activated state (logical high) as shown by a broken line. The block selective signal BS0 is activated to be logical high at t4. The selective transistor ST corresponding to the activated block selective signal BS0 (see FIG. 2) is thus switched on. At this time, because the cell transistors T in the unselected memory cells MC connected to the unselected word lines WL1 to WL7 are on, the ferroelectric capacitor C in the memory cell MC0 is electrically connected between the bit line BL and the plate line PL0. The unselected block selective signal BS1 keeps the inactivated state (logical low). The signal φt is activated to be logical high at t5. Thus, the bit line pair BL, bBL is respectively connected to the sense node pair SN and bSN. The plate line PL0 corresponding to the block selective signal BS0 is activated to be logical high at t6. The data stored in the selected memory cell MC0 is thus transmitted via the bit line BL to the sense node SN. At this time, the reference data indicating the intermediate potential between data "0" and data "1" is transmitted to the sense node bSN. Accordingly, the potential difference between the data from the selected memory cell MC0 and the reference data is expanded between the sense nodes SN and bSN. The sense amplifier activating signals SAN and BSAN are activated at t7. The sense amplifier SA thus amplifies the potential difference between the sense nodes SN and bSN and latches the resultant potential difference between the sense nodes SN and bSN. The column selective line CSL is then activated, so that the data detected by the sense amplifier SA is outputted externally as DOUT. The bit line BL is logical high (for example, has the data "1") in the embodiment shown in FIG. 4.

After the data is externally outputted, the plate line PL0 falls to be logical low at t8. The potential difference between the bit line BL and the plate line PL0 is then applied to the ferroelectric capacitor C in the selected memory cell MC0. Thus, for example, the data "1" is written back to the selected memory cell MC0 (restored).

The sense amplifier SA is inactivated at t9. The equalizing circuit EQ is activated at t10 and the bit line pair BL, bBL is set to be equipotential (Vss). The bit line pair BL, bBL is then disconnected from the sense node pair SN, bSN at t11. Thereafter, the block selective signal BS0 is inactivated to be logical low and the selected word line WL0 is activated to be logical high. The chip enable signal bCE and the restore signal bRESTOR are inactivated. After the restore signal bRESTOR is inactivated, the ferroelectric memory can enter the write operation.

The restore signal bRESTOR is kept logically high during the first period T1 from t2 to t12 in the first embodiment. Thus, the inactivated state (logical high) of the write enable signal bWE2 is kept regardless of the logical value of the signal bWE. Accordingly, even if a user put the write enable signal bWE in the activated state (logical low) during the read operation, the restore operation can be performed surely during the read operation.

When the memory enters the write operation, the restore signal bRESTOR and the write enable signal bWE become logical low. The write enable signal bWE2 is thus activated to be logical high. In the write operation, the sense amplifier SA writes the externally received write data in the memory cell MC instead of the restore operation. Because other processes in the write operation are the same as in the read operation, descriptions thereof will be omitted.

Second Embodiment

Figure 5:
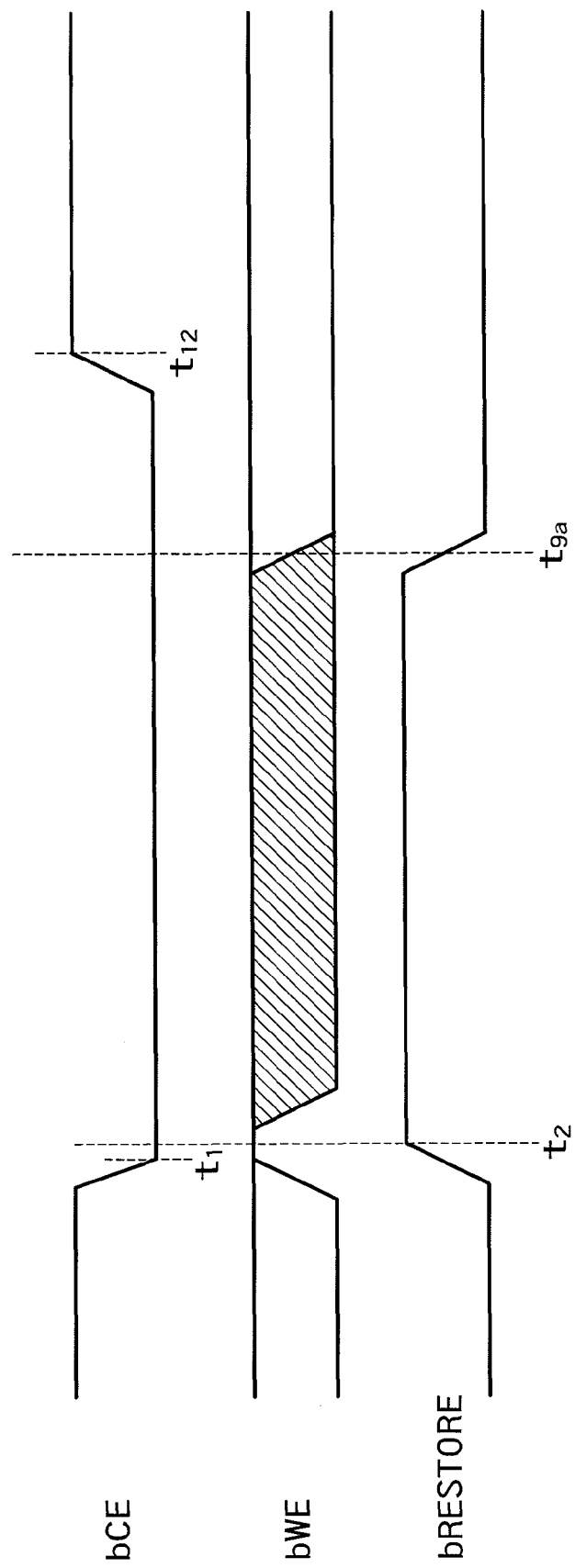
FIG. 5 is a timing chart showing a read operation of a ferroelectric memory according to a second embodiment of the present invention.

FIG. 5 is a timing chart showing a read operation of a ferroelectric memory according to a second embodiment of the present invention. The configuration of the ferroelectric memory according to the second embodiment can be identical to that in the first embodiment. The second embodiment is a chip enable read/write mode product performing the read or write operation depending on the logical value of the write enable signal when the chip enable signal is activated, as in the first embodiment.

When the restore signal bRESTOR is inactivated (the restore operation is completed) before the chip enable signal bCE is in an inactivated state (logical high), the write enable signal bWE is made to be invalid until the restore signal bRESTOR becomes inactivated (logical low). That is, when the restore operation is completed before the chip enable signal bCE is inactivated (logical high) after inactivation, the ferroelectric memory can enter the write operation at any point before the chip enable signal bCE is inactivated since the restore operation has been completed. This is because as long as the write enable signal bWE and the restore signal bRESTOR are inactivated, the ferroelectric memory can enter the write operation quickly.

According to the second embodiment, the read operation and the restore operation described in the first embodiment are completed before t9a at which the restore signal bRESTOR becomes inactivated (logical low). After t9a, the ferroelectric memory can enter the write operation. The second embodiment can achieve effects identical to those of the first embodiment.

Third Embodiment

Figure 6:
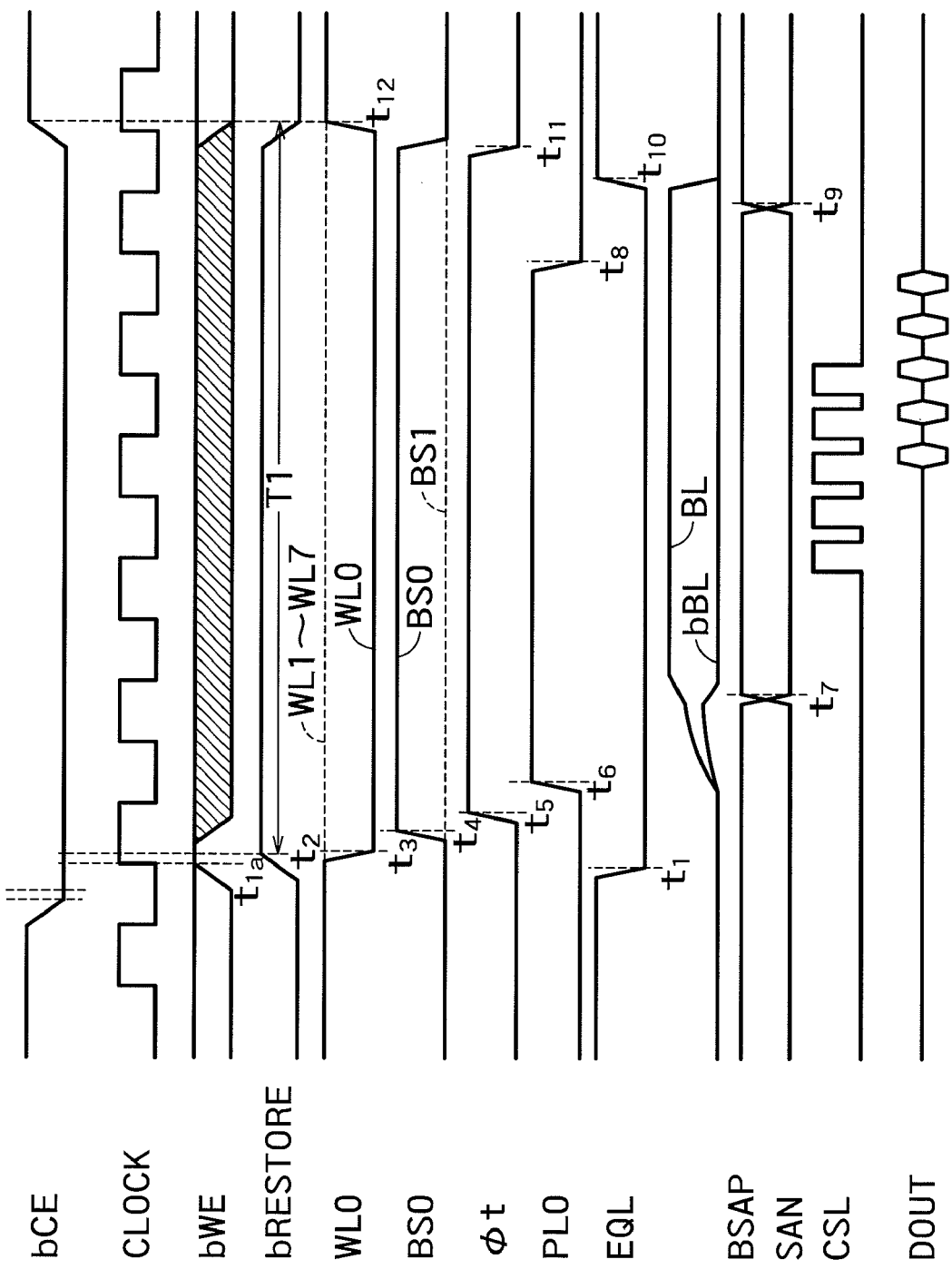
FIG. 6 is a timing chart showing a read operation of a ferroelectric memory according to a third embodiment of the present invention.

FIG. 6 is a timing chart showing a read operation of a ferroelectric memory according to a third embodiment of the present invention. The configuration of the ferroelectric memory according to the third embodiment can be basically identical to that in the first embodiment. However, unlike the first and second embodiments, the third embodiment is a burst read/write mode product. Thus, according to the third embodiment, the memory enters the data read operation by an externally supplied clock signal being activated (rising) while the write enable signal bWE is inactivated (logical high). That is, the sense amplifier SA starts the data read operation at t1 or immediately after t1. At this time, the restore signal is activated.

The burst read/write mode product designates a row address to access a plurality of successive column addresses from the row address and reads or writes data serially.

The operation of the third embodiment during the period from when the memory enters the data read operation to when the chip enable signal bCE and the restore signal bRESTOR are inactivated (t2 to t12) is substantially the same as the one from t2 to t12 in the first embodiment. Because the data read/data write is performed in a burst mode in the third embodiment, when the data is read from the sense amplifier SA via the I/O circuit to external of the chip, the data is serially read depending on the clock signal. Further, when the externally received write data is written through the I/O circuit to the sense amplifier SA, the data is serially written depending on the clock signal. Thus, as indicated by the column selective line CSL and the data output signal DOUT in FIG. 6, bit lines in a plurality of columns are selected successively and the data is serially outputted.

The third embodiment comprises the NOR circuit like the first embodiment. The NOR circuit makes the write enable signal bWE invalid during the read operation that the restore signal bRESTOR is kept logically high. Even if a user activates the write enable signal bWE to be logical low, the inactivated state (logical low) of the write enable signal bWE2 is kept regardless of the logical value of the write enable signal bWE. As a result, the restore operation can be completed reliably during the read operation (the first period T1).

Fourth Embodiment

Figure 7:
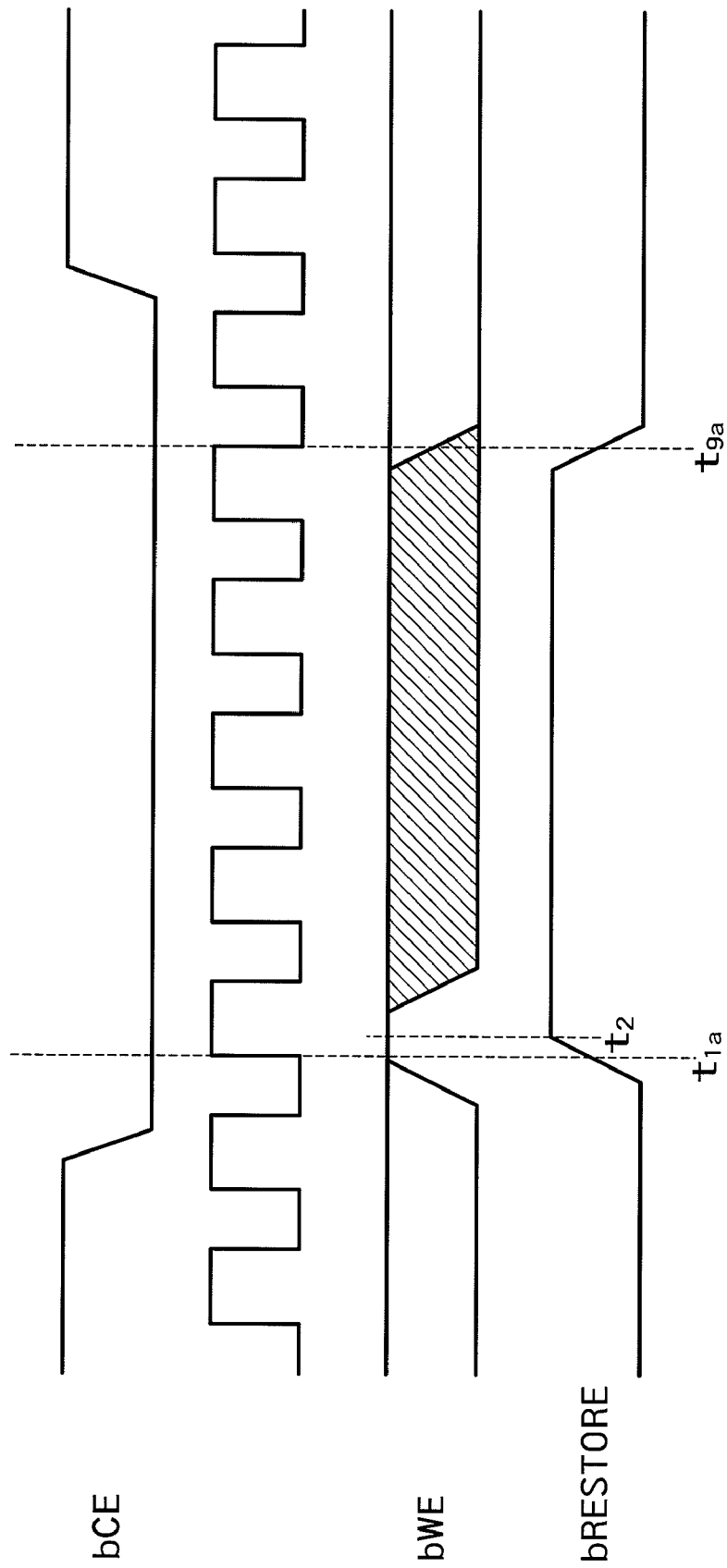
FIG. 7 is a timing chart showing a read operation of a ferroelectric memory according to a fourth embodiment of the present invention.

FIG. 7 is a timing chart showing a read operation of a ferroelectric memory according to a fourth embodiment of the present invention. The configuration of the ferroelectric memory according to the fourth embodiment can be identical to that in the third embodiment. The fourth embodiment is the burst read/write mode product as in the third embodiment.

When the restore signal bRESTOR is inactivated (the restore operation is completed) before the chip enable signal bCE is inactivated (logical high), the write enable signal bWE is made to be invalid until the restore signal bRESTOR is inactivated (logical low). That is, when the restore operation is completed before the chip enable signal bCE is inactivated (logical high), the ferroelectric memory can enter the write operation at any point before the chip enable signal bCE is inactivated since the restore operation has been completed. This is because as long as the write enable signal bWE and the restore signal bRESTOR are inactivated, the ferroelectric memory can enter the write operation quickly.

According to the fourth embodiment, the read operation and the restore operation described in the first embodiment are completed before t9a at which the restore signal bRESTOR is in an inactivated state (logical low). The ferroelectric memory can enter the write operation after t9a. The fourth embodiment can achieve effects identical to those of the first embodiment.

Note that the data read/data write is performed in a burst mode in the fourth embodiment like third embodiment, and thus, when the data is read from the sense amplifier SA through the I/O circuit to external of the chip, the data is read serially depending on the clock signal. When the externally received write data is written through the I/O circuit in the sense amplifier SA, the data is written serially depending on the clock signal. As shown by the column selective line CSL and the data output signal DOUT in FIG. 6, bit lines in a plurality of the columns are successively selected and the data is serially outputted.

Fifth Embodiment

Figure 8:
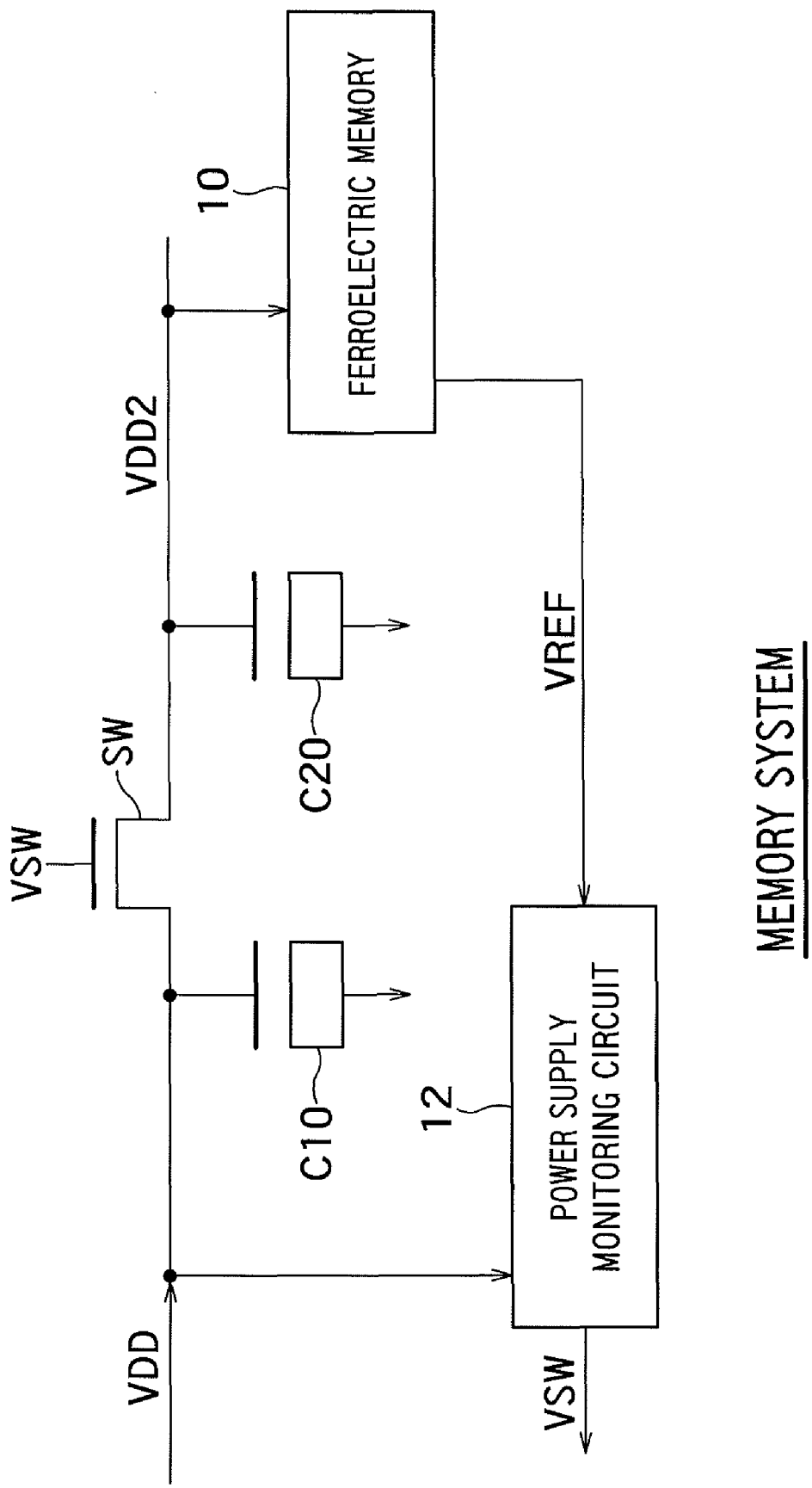
FIG. 8 is a block diagram showing an example of configuration of a memory system according to a fifth embodiment of the present invention.

FIG. 8 is a block diagram showing an example of configuration of a memory system according to a fifth embodiment of the present invention. The memory system of the fifth embodiment comprises a ferroelectric memory 10, a power supply monitoring circuit 12, a switch SW, and stabilizing capacities C10 and C20. The power supply monitoring circuit 12, the switch SW, and the stabilizing capacities C10 and C20 can be incorporated into the memory chip. For example, the power supply monitoring circuit 12, the switch SW, and the stabilizing capacities C10 and C20 can be incorporated into the internal power supply circuit 9 shown in FIG. 1. Alternatively, the power supply monitoring circuit 12, the switch SW, and the stabilizing capacities C10 and C20 can be provided outside the memory chip as an external power supply circuit.

The switch SW is provided between an external power supply voltage VDD and the ferroelectric memory 10. The stabilizing capacity C10 is connected between a node of the external power supply voltage VDD and the switch SW and a ground. The stabilizing capacity C20 is connected between a node of the switch SW and the ferroelectric memory 10 and the ground. The power supply monitoring circuit 12 monitors changes in the external power supply VDD.

The power supply monitoring circuit 12, the switch SW, and the stabilizing capacities C10 and C20 are configured to keep a power supply voltage supplied to the ferroelectric memory during the first period T1 at a certain value or higher.

The ferroelectric memory 10 comprises the ferroelectric memory described in any of the first to fourth embodiments. The power supply monitoring circuit 12 receives the external power supply voltage VDD and a reference power supply voltage VREF serving as a threshold for the external power supply voltage and compares them. As a result of comparison, when VDD is lower than VREF, the power supply monitoring circuit 12 sets a switch control signal VSW to have a low level potential. When the switch control signal VSW becomes low level, the switch SW is turned off, and thus the external power supply is disconnected from the ferroelectric memory 10. At this time, the stabilizing capacity C20 applies the power supply voltage to the ferroelectric memory 10. The power supply voltage from the stabilizing capacity C20 is used for Vext or Vint in the ferroelectric memory 10.

Such a memory system can keep the power supply voltage (Vext or Vint shown in FIG. 1) supplied to the ferroelectric memory 10 at a certain value or higher during the read operation even if the external power supply VDD is shut down. Thus, the logical value of the write enable signal bWE2 can be kept and the restore operation can be completed.

Figure 9:
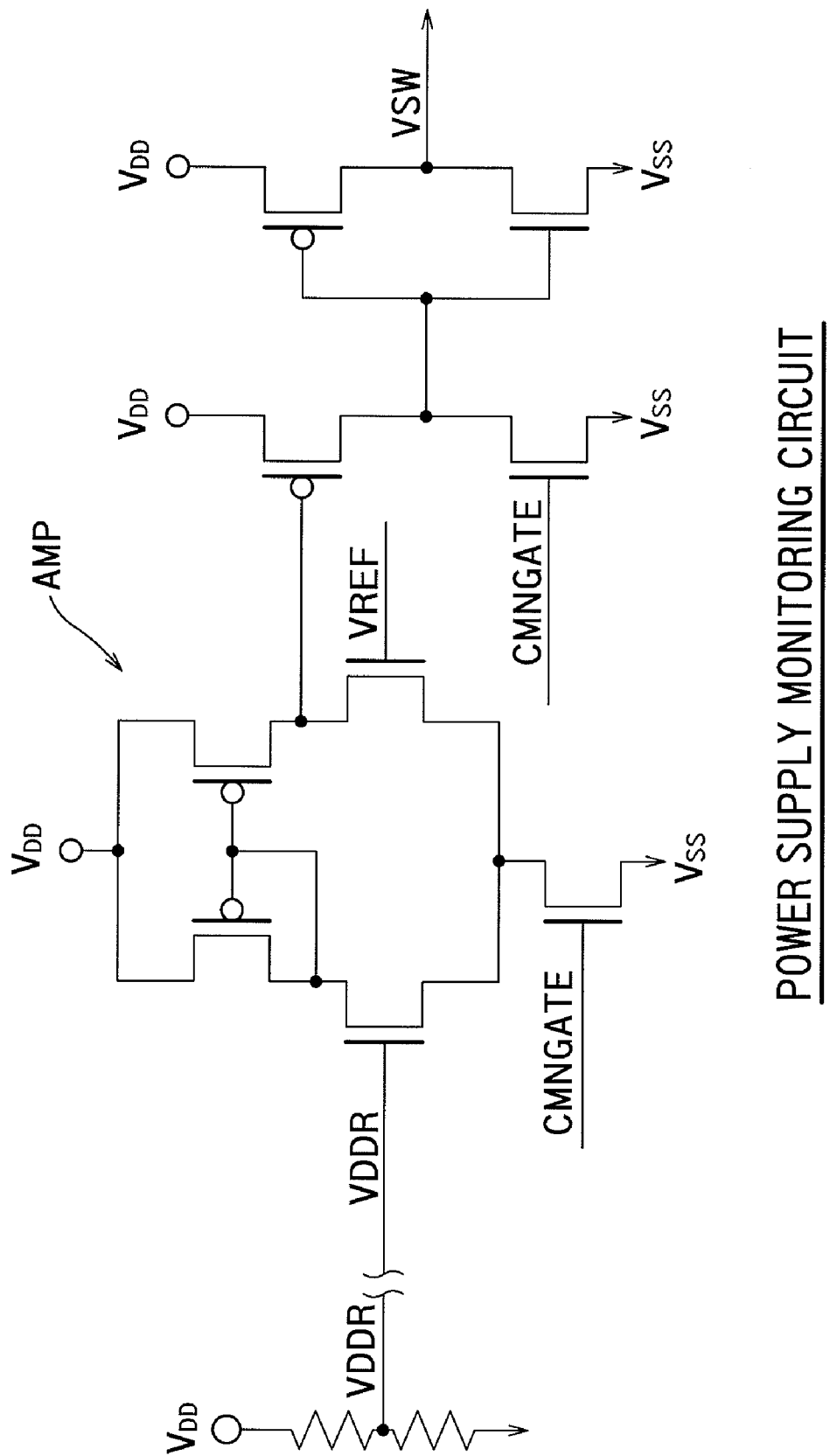
FIG. 9 is a circuit diagram showing an example of the power supply monitoring circuit 12.

FIG. 9 is a circuit diagram showing an example of the power supply monitoring circuit 12. The power supply monitoring circuit 12 monitors the external power supply voltage VDD using an operational amplifier AMP. A potential VDDR produced by resistive-dividing the external power supply VDD is inputted to a non-inverted input terminal of the operational amplifier AMP. A potential VREF produced by resistive-dividing an internally generated power supply VPP for boosting the word lines is inputted to an inverted input terminal of the operational amplifier AMP. Because the power supply VPP is a voltage charged in the word lines with large capacity, it does not attenuate in a short time. Thus, the power supply VPP can be used sufficiently to generate the reference supply potential VREF with a fixed voltage.

When VDD becomes lower than VREF, VSW becomes low level. Thus, the switch SW can be turned off. When VDD becomes higher than VREF, VSW becomes high level. The switch SW is thus turned on and VDD is supplied to the ferroelectric memory 10.

The invention claimed is:

1. A semiconductor memory device comprising:
   a memory cell array configured by two-dimensionally arranging destructive read-out type memory cells that stored data is degraded by data read;
   a decoder configured to select a memory cell in the memory cell array;
   a sense amplifier configured to detect the data stored in the selected memory cell; and
   a read and write controller configured to control a read operation for reading data externally from the memory cell and a write operation for writing external data in the memory cell, wherein
   the read and write controller outputs a logical value of a write enable signal at the start of the read operation in a first period and makes the write enable signal invalid after the read operation starts during the first period, on the basis of the write enable signal and a restore signal keeping an activated state during the first period, the write enable signal being a signal allowing the write operation, the first period being a period from when the read operation starts to when a restore operation for writing the data back to the memory cell is completed.

2. The device of claim 1, wherein the sense amplifier starts the read operation and the restore signal is activated when an externally supplied chip enable signal is activated under the write enable signal being in an inactivated state, and
   the read and write controller comprises a logical part configured to receive the write enable signal and the restore signal and to perform a logical operation of them in order to output continuously the logical value of the write enable signal at the start of the read operation during the first period.

3. The device of claim 1, wherein the sense amplifier starts the data read operation and the restore signal is activated when an externally supplied clock signal is activated under the write enable signal being in an inactivated state, and
   the read and write controller comprises a logical part configured to receive the write enable signal and the restore signal and to perform a logical operation of them in order to output continuously the logical value of the write enable signal at the start of the data read operation during the first period.

4. The device of claim 2, wherein the restore signal is inactivated before the chip enable signal is inactivated, and
   the read and write controller activates the write enable signal at any time point before the chip enable signal is inactivated after the restore signal has been inactivated, in such a manner that the data write operation can be performed.

5. The device of claim 3, wherein the restore signal is inactivated before the chip enable signal is inactivated, and
   the read and write controller activates the write enable signal at any time point before the chip enable signal is inactivated after the restore signal has been inactivated, in such a manner that the data write operation can be performed.

6. A memory system comprising:
   the semiconductor memory device according to claim 1; and
   a power supply circuit configured to keep a power supply voltage to be supplied to the semiconductor memory device at a certain voltage or higher during the first period, wherein
   the power supply circuit comprises:
   a switch between an external power supply and the semiconductor memory device;
   a stabilizing capacity connected to a node between the switch and the semiconductor memory device; and
   a power supply monitoring circuit configured to receive a voltage of the external power supply and a reference power supply voltage and to compare the external power supply voltage to the reference power supply voltage, the reference power supply voltage serving as a threshold for the external power supply voltage,
   wherein the power supply monitoring circuit turns off the switch when the external power supply voltage gets across the reference power supply voltage.

7. A memory system comprising:
   the semiconductor memory device according to claim 2; and
   a power supply circuit configured to keep a power supply voltage to be supplied to the semiconductor memory device at a certain voltage or higher during the first period, wherein
   the power supply circuit comprises:
   a switch between an external power supply and the semiconductor memory device;
   a stabilizing capacity connected to a node between the switch and the semiconductor memory device; and
   a power supply monitoring circuit configured to receive a voltage of the external power supply and a reference power supply voltage and to compare the external power supply voltage to the reference power supply voltage, the reference power supply voltage serving as a threshold for the external power supply voltage,
   wherein the power supply monitoring circuit turns off the switch when the external power supply voltage gets across the reference power supply voltage.

8. A memory system comprising:
   the semiconductor memory device according to claim 3; and
   a power supply circuit configured to keep a power supply voltage to be supplied to the semiconductor memory device at a certain voltage or higher during the first period, wherein the power supply circuit comprises:

a switch between an external power supply and the semiconductor memory device;

a stabilizing capacity connected to a node between the switch and the semiconductor memory device; and a power supply monitoring circuit configured to receive a voltage of the external power supply and a reference power supply voltage and to compare the external power supply voltage to the reference power supply voltage, the reference power supply voltage serving as a threshold for the external power supply voltage, wherein the power supply monitoring circuit turns off the switch when the external power supply voltage gets across the reference power supply voltage.

9. A memory system comprising:

the semiconductor memory device according to claim 4; and a power supply circuit configured to keep a power supply voltage to be supplied to the semiconductor memory device at a certain voltage or higher during the first period, wherein the power supply circuit comprises:

a switch between an external power supply and the semiconductor memory device;

a stabilizing capacity connected to a node between the switch and the semiconductor memory device; and a power supply monitoring circuit configured to receive a voltage of the external power supply and a reference power supply voltage and to compare the external power supply voltage to the reference power supply voltage, the reference power supply voltage serving as a threshold for the external power supply voltage, wherein the power supply monitoring circuit turns off the switch when the external power supply voltage gets across the reference power supply voltage.

* * * * *